(12) United States Patent
Lu et al.

(10) Patent No.: US 10,991,409 B2
(45) Date of Patent: *Apr. 27, 2021

(54) ENCODER FOR MEMORY SYSTEM AND METHOD THEREOF

(71) Applicant: SK hynix Inc., Gyeonggi-do (KR)

(72) Inventors: Xuanxuan Lu, San Jose, CA (US); Chenrong Xiong, San Jose, CA (US); Fan Zhang, San Jose, CA (US); Haobo Wang, San Jose, CA (US); Meysam Asadi, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/517,212

(22) Filed: Jul. 19, 2019

(65) Prior Publication Data

US 2021/0020217 A1    Jan. 21, 2021

(51) Int. Cl.
*G11C 11/16* (2006.01)
*G06F 12/14* (2006.01)
*G06F 11/10* (2006.01)

(52) U.S. Cl.
CPC ...... *G11C 11/1657* (2013.01); *G06F 11/1004* (2013.01); *G06F 11/1032* (2013.01); *G06F 12/1408* (2013.01); *G11C 11/1673* (2013.01); *G11C 11/1675* (2013.01)

(58) Field of Classification Search
None
See application file for complete search history.

(56) References Cited

U.S. PATENT DOCUMENTS

| | | | |
|---|---|---|---|
| 7,269,778 B1* | 9/2007 | Feng | H03M 5/145 341/59 |
| 8,451,658 B2 | 5/2013 | Sharon et al. | |
| 8,959,404 B2 | 2/2015 | Yang | |
| 2010/0306619 A1* | 12/2010 | Yang | G06F 11/1072 714/758 |
| 2011/0035645 A1* | 2/2011 | Yang | G06F 12/0246 714/763 |
| 2013/0173983 A1* | 7/2013 | Chung | G06F 11/1048 714/752 |
| 2016/0070506 A1* | 3/2016 | Blaettler | G11C 7/1006 711/154 |
| 2019/0340068 A1* | 11/2019 | Bhatia | G11C 29/34 |

* cited by examiner

*Primary Examiner* — J. H. Hur
(74) *Attorney, Agent, or Firm* — IP & T Group LLP

(57) ABSTRACT

An encoder for use in a memory system receives data bits and position information regarding a storage area among storage areas of a memory device in which the data bits are to be stored, determining the number of multiple random sequences to be used based on the position information, scrambling the data bits using the determined number of multiple random sequences, to generate scrambled sequences, selecting from among the generated scrambled sequences the scrambled sequence having the lowest number of a particular logic value, and outputting the selected scrambled sequence for storage in the storage area of the memory device.

20 Claims, 14 Drawing Sheets

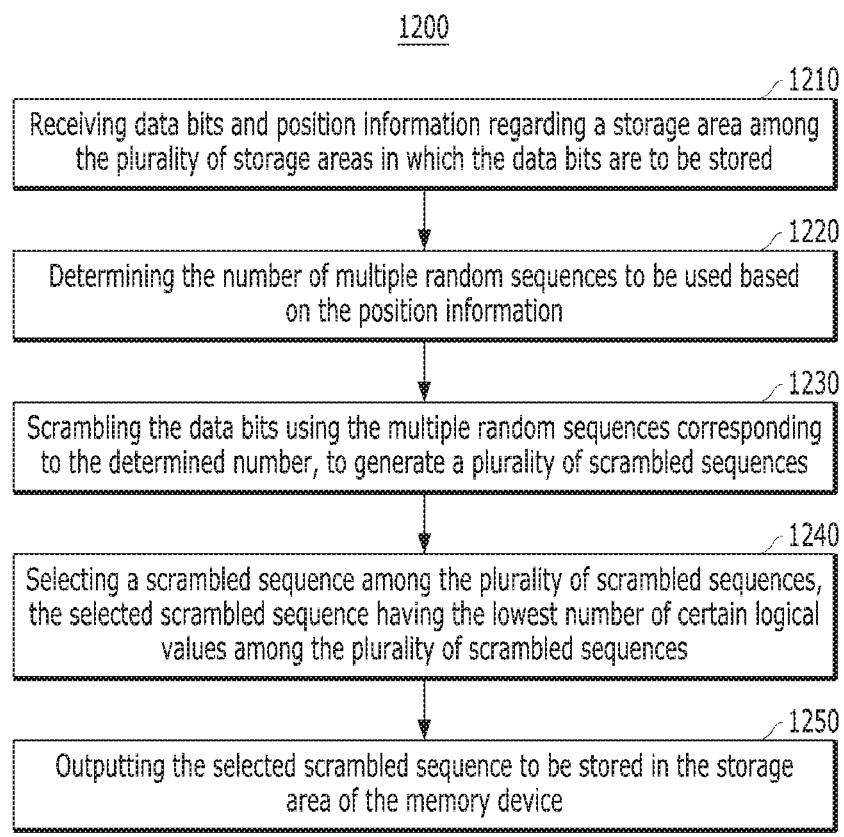

ENCODER FOR MEMORY SYSTEM AND METHOD THEREOF

BACKGROUND

1. Field

Embodiments of the present disclosure relate to encoding and decoding schemes for a memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since they have no moving parts. Examples of memory systems having such advantages include universal serial bus (USB) memory devices, memory cards having various interfaces such as a universal flash storage (UFS), and solid state drives (SSDs). Memory systems may use various kinds of encoder.

SUMMARY

Aspects of the present invention include a memory system including an encoder capable of reducing occurrences of weak bits.

In one aspect, a memory system includes a memory device including a plurality of storage areas and a controller including an encoder. The encoder receives data bits and position information regarding a storage area among a plurality of storage areas of a memory device in which the data bits are to be stored, determines the number of multiple random sequences to be used based on the position information, scrambles the data bits using the determined number of multiple random sequences, to generate a plurality of scrambled sequences, selects a scrambled sequence among the plurality of scrambled sequences, the selected scrambled sequence having the lowest number of a particular logic value among the plurality of scrambled sequences, and outputs the selected scrambled sequence for storage in the storage area of the memory device.

In another aspect, a method for operating a memory system includes a memory device including a plurality of storage areas. The method includes: receiving data bits and position information regarding a storage area among the plurality of storage areas in which the data bits are to be stored; determining the number of multiple random sequences to be used based on the position information; scrambling the data bits using the determined number of multiple random sequences, to generate a plurality of scrambled sequences; selecting a scrambled sequence among the plurality of scrambled sequences, the selected scrambled sequence having the lowest number of a particular logic value among the plurality of scrambled sequences; and outputting the selected scrambled sequence for storage in the storage area of the memory device.

Additional aspects of the present invention will become apparent from the following description.

BRIEF DESCRIPTION OF THE DRAWINGS

FIG. 12 is a flowchart illustrating an operation of an encoder in accordance with an embodiment of the present invention.

DETAILED DESCRIPTION

Figure 1:
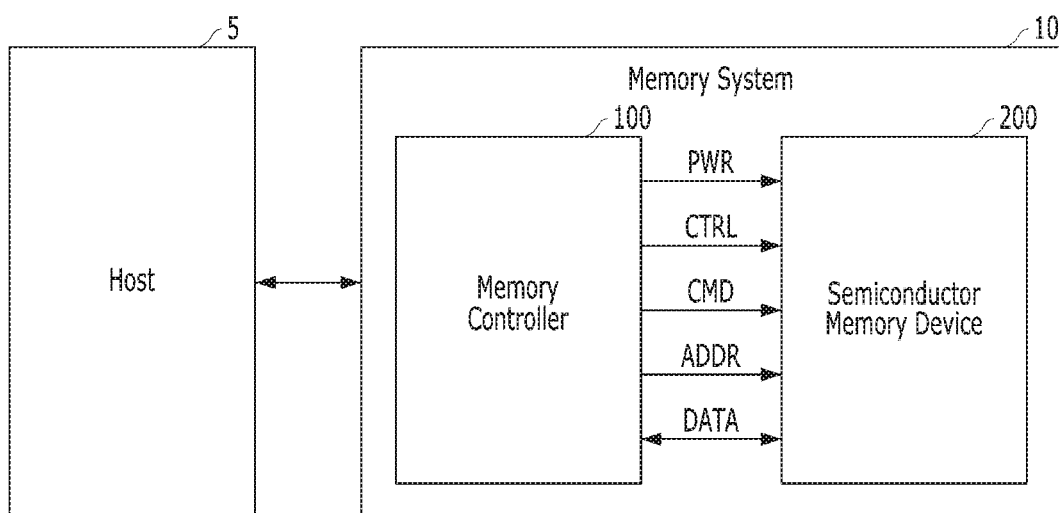
FIG. 1 is a block diagram illustrating a data processing system in accordance with an embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram illustrating a data processing system 2 in accordance with an embodiment of the present invention.

Referring FIG. 1, the data processing system 2 may include a host device 5 and a memory system 10. The memory system 10 may receive a request from the host device 5 and operate in response to the received request. For example, the memory system 10 may store data to be accessed by the host device 5.

The host device 5 may be implemented with any one of various kinds of electronic devices. In various embodiments, the host device 5 may include an electronic device such as a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may include a portable electronic device such as a mobile phone, a smart phone, an e-book, an MP3 player, a portable multimedia player (PMP), and/or a portable game player.

The memory system 10 may be implemented with any one of various kinds of storage devices such as a solid state drive (SSD) and a memory card. In various embodiments, the memory system 10 may be provided as one of various components in an electronic device such as a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200. The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal CTRL may include a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host device (e.g., host device 5 of FIG. 1) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

Figure 2:
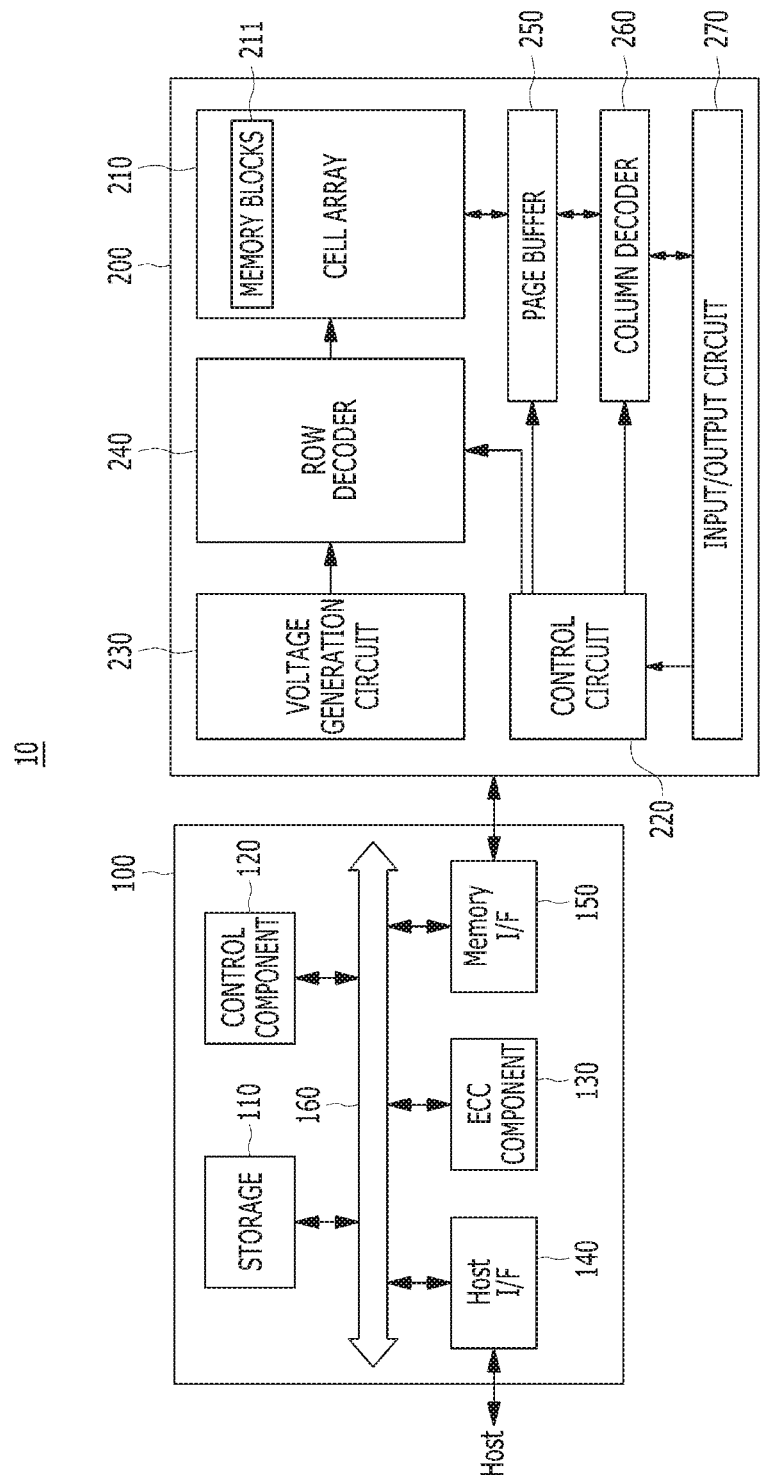
FIG. 2 is a block diagram illustrating a memory system in accordance with an embodiment of the present invention.

FIG. 2 is a block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device (e.g., host device 5 of FIG. 1), and in particular, store data to be accessed by the host device.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In various embodiments, the ECC component 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices for suitable error correction operation.

The host interface 140 may communicate with the host device through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. When the memory device 200 is a flash memory such as a NAND flash memory, the memory interface 150 may generate control signals for the memory and process data under the control of the control component 120.

The memory device 200 may include a memory cell array 210, a control circuit 220, a voltage generation circuit 230, a row decoder 240, a page buffer 250, which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
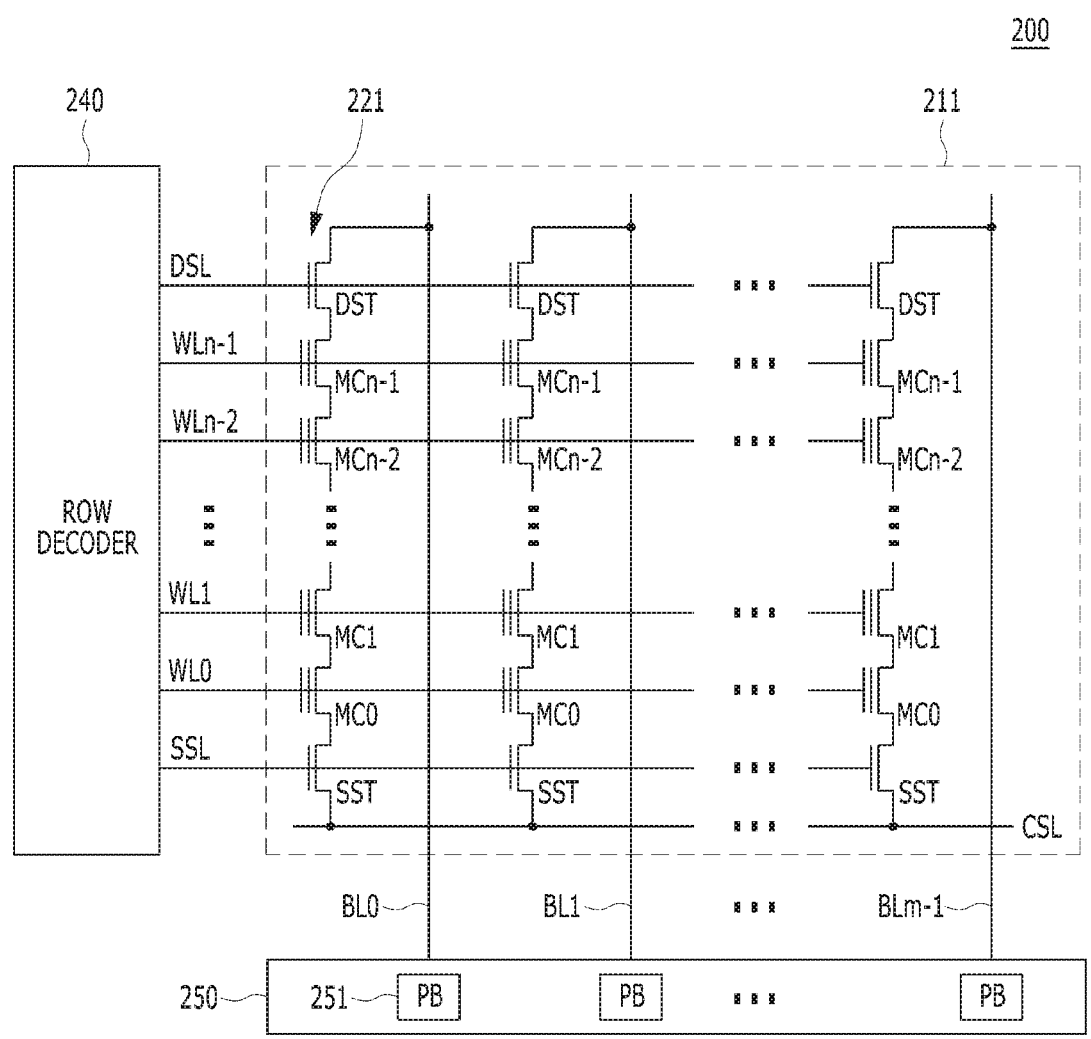
FIG. 3 is a circuit diagram illustrating a memory block of a memory device in accordance with an embodiment of the present invention.

The page buffer 250 may be coupled with the memory cell array 210 through bit lines BL (shown in FIG. 3). The page buffer 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or transmit and receive data to and from the input/output circuit 270.

The input/output circuit 270 may transmit to the control circuit 220 a command and an address, received from an external device (e.g., the memory controller 100 of FIG. 1), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the exemplary memory block 211 may include a plurality of word lines WL0 to WLn-1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm-1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn-1 may be serially coupled between the selection transistors DST and SST. Each of the memory cells may be formed as a multiple level cell. For example, each of the memory cells may be formed as a single level cell (SLC) storing 1 bit of data. Each of the memory cells may be formed as a multi-level cell (MLC) storing 2 bits of data. Each of the memory cells may be formed as a triple-level cell (TLC) storing 3 bits of data. Each of the memory cells may be formed as a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm−1. The page buffers 251 may operate in response to page buffer control signals. For example, the page buffers 251 my temporarily store data received through the bit lines BL0 to BLm−1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

A memory device such as a flash memory (e.g., NAND flash memory) may include a plurality of memory blocks (e.g., hundreds to thousands of memory blocks). Each block typically may include a plurality of wordlines (e.g., hundreds of wordlines). Each cell coupled to each wordline may include multiple logical pages. The memory device may include a plurality of memory cells and store multiple bits per cell by modulating the cell into different states or program voltage (PV) levels through a programming operation.

Figure 4:
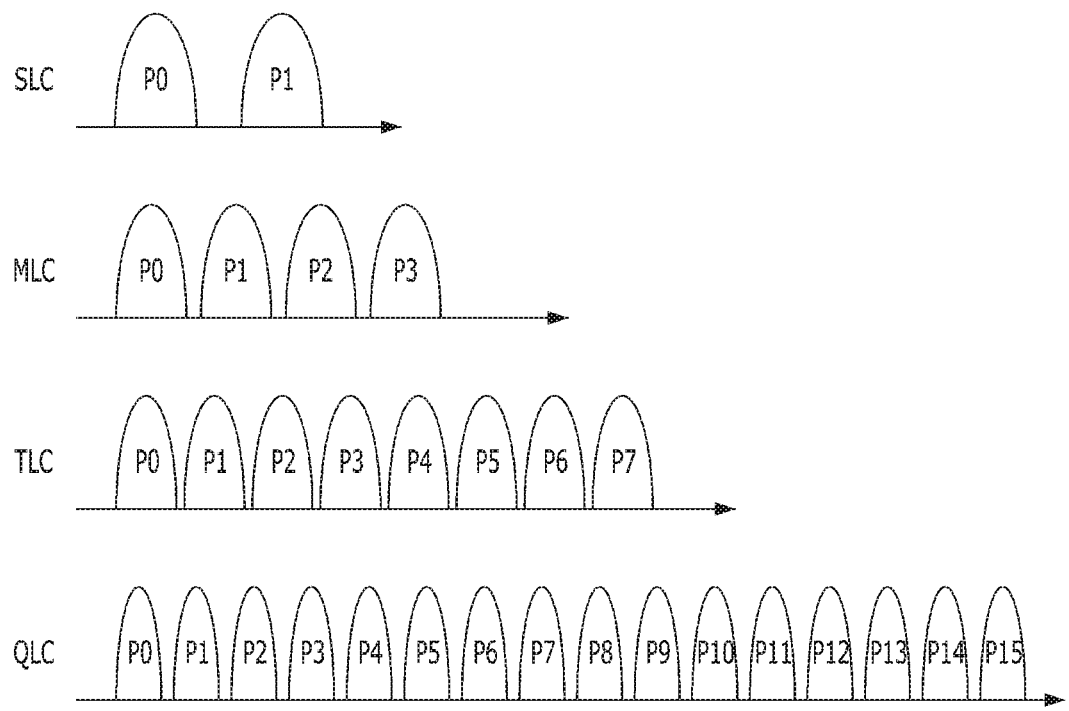
FIG. 4 is a diagram illustrating distributions of states for cells of a memory device.

FIG. 4 is a diagram illustrating distributions of states or program voltage (PV) levels for different types of cells of a memory device.

Referring to FIG. 4, each of memory cells may be implemented with multiple level cells, for example, a single level cell (SLC) storing 1 bit of data, a multi-level cell (MLC) storing 2 bits of data, a triple-level cell (TLC) storing 3 bits of data, or a quadruple-level cell (QLC) storing 4 bits of data.

SLCs may include two states P0 and P1. P0 may indicate an erase state, and P1 may indicate a program state. Since the SLC can be set in one of two different states, each SLC may program or store 1 bit according to a set coding method. MLCs may include four states P0, P1, P2 and P3. Among these states, P0 may indicate an erase state, and P1 to P3 may indicate program states. Since the MLC can be set in one of four different states, each MLC may program or store two bits according to a set coding method. TLCs may include eight states P0 to P7. Among these states, P0 may indicate an erase state, and P1 to P7 may indicate program states. Since the TLC can be set in one of eight different states, each TLC may program or store three bits according to a set coding method. QLCs may include 16 states P0 to P15. Among these states, P0 may indicate an erase state, and P1 to P15 may indicate program states. Since the QLC can be set in one of sixteen different states, each QLC may program or store four bits according to a set coding method.

Figure 5A:
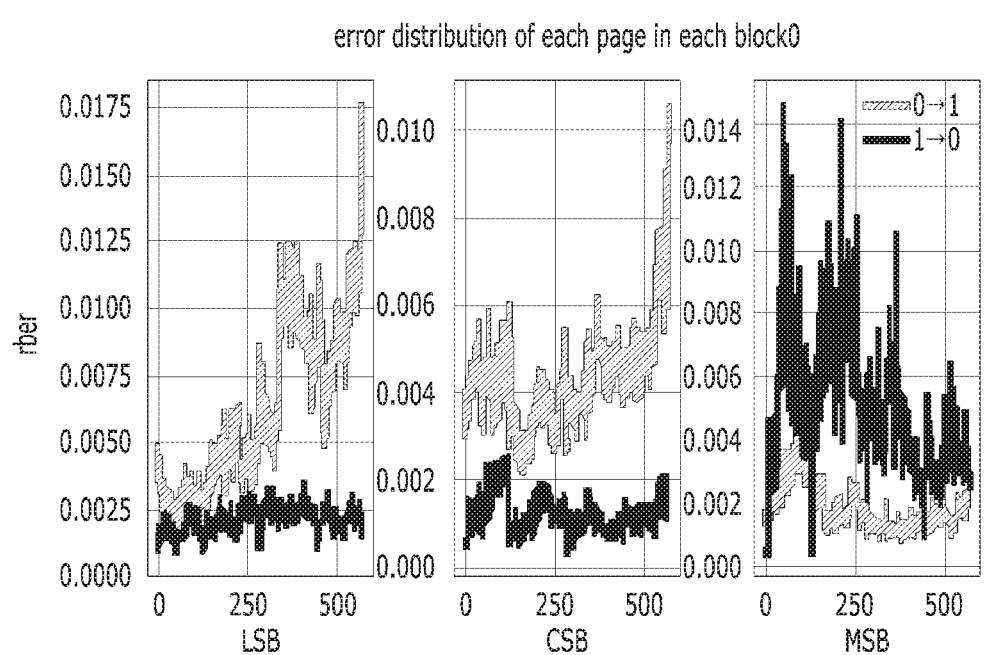
FIGS. 5A and 5B are diagrams illustrating distributions of bit error rates for different pages of different blocks in a memory device.
Figure 5B:
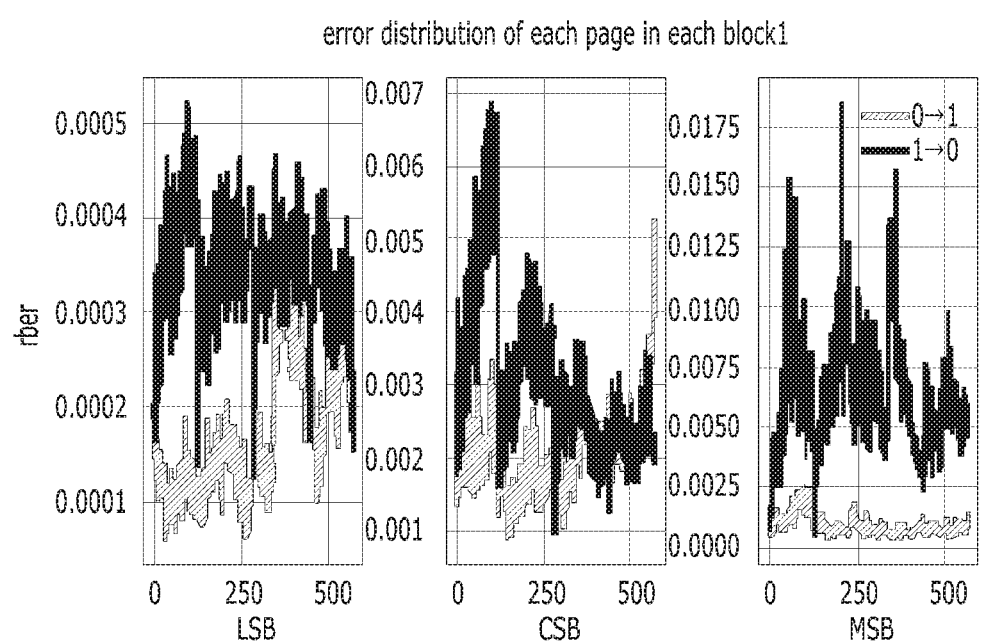

As such, for a memory device including TLCs, there are 8 states or PV levels and each level corresponds to a unique 3-bit tuple. First, second and third bits of cells are grouped together into a least significant bit (LSB) page, a center significant bit (CSB) page and a most significant bit (MSB) page, respectively. The different PV levels usually have different noise variances, and hence a probability of 1→0 errors (i.e., $p_{1 \to 0}$) and a probability of 0→1 errors (i.e., $p_{0 \to 1}$) differs for each logical page, each wordline and each block, as shown in FIGS. 5A and 5B. $p_{1 \to 0}$ may represent bit error rate when a bit having a logic high value (i.e., bit-1) is stored in a corresponding page, and $p_{0 \to 1}$ may represent bit error rate when a bit having a logic low value (i.e., bit-0) is stored in a corresponding page. $p_{1 \to 0}$ may occurs when bit-1 is incorrectly read as bit-0, and $p_{0 \to 1}$ may occur when bit-0 is incorrectly read as bit-1.

FIGS. 5A and 5B are diagrams illustrating distributions of bit error rates for different logical pages of different blocks in a memory device, for example, a triple-level cell (TLC) NAND-type flash memory device.

In FIGS. 5A and 5B, the x-axis represents logical pages LSB, CSB or MSB and the y-axis represents raw bit error rates (rber) (or an error probability). In FIG. 5A, for each of logical pages LSB, CSB or MSB of a block 0, $p_{0 \to 1}$ is different from $p_{1 \to 0}$. In FIG. 5B, for each of logical pages LSB, CSB or MSB of a block 1, $p_{0 \to 1}$ is different from $p_{1 \to 0}$. In addition, for the same logical pages LSB, CSB or MSB, $p_{0 \to 1}$ of the block 0 is different from $p_{0 \to 1}$ of the block 1 and $p_{1 \to 0}$ of the block 0 is different from $p_{1 \to 0}$ of the block 1. In other words, the error probability may depend on stored bit value ("0" or "1") and its position (or storage area) of TLC NAND-type flash memory device. The position may be a logical page, a wordline and a block regarding data to be stored in the memory device.

Thus, various embodiments provide a scheme to reduce bit error rates in a memory device such as TLC NAND-type flash memory device.

Figure 6:
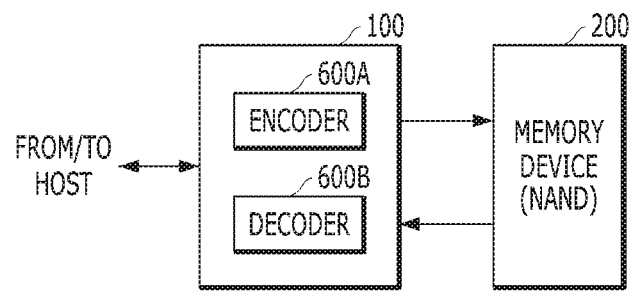
FIG. 6 is a diagram illustrating a memory system in accordance with an embodiment of the present invention.

FIG. 6 is a diagram illustrating a memory system in accordance with an embodiment of the present invention.

Referring to FIG. 6, the memory system may include a controller 100 and a memory device 200. The memory device 200 may include a NAND-type flash memory device with memory cells such as single-level cells (SLCs), multi-level cells (MLCs), triple-level cells (TLCs) or quadruple-level cells (QLCs). In various embodiments, the memory device 200 may include a NAND-type flash memory device with QLC memory cells (i.e., QLCs).

The controller 100 may receive a command from a host, and provide the memory device 200 with the received command. For example, the controller 100 receives a write command and write data corresponding to the write command, and controls the memory device 200 to perform a program operation on the write data. For another example, the controller 100 receives a read command, and controls the memory device 200 to perform a read operation on data corresponding to the read command. The controller 100 transmits read data corresponding to the read command to the host.

The controller 100 may include an encoder 600A, and a decoder 600B. During the program operation, the encoder 600A may perform an encoding operation on the write data based on a set encoding scheme. During the read operation, the decoder 600B may perform a decoding operation on the read data based on a set decoding scheme corresponding to the encoding scheme. The encoding schemes will be described below with reference to FIGS. 7 to 12. The controller 100 and the memory device 200 may perform the operations described in FIGS. 1 and 2. In an embodiment, the encoder 600A and decoder 600B may be embodied in the ECC component 130 of the controller 100 shown in FIG. 2. Other suitable arrangements may be employed as well, as explained below. In general, the encoder 600A and decoder 600B may be implemented by hardware, software, firmware, or any suitable combination thereof.

In various embodiments, the encoder 600A may perform encoding operations using multiple scrambling (i.e., guided scrambling) before a program operation, in order to reduce bit error rates in the memory device 200 such as TLC NAND-type flash memory device. That is, the encoder 600A may function as a guided scrambling encoder. The decoder 600B may perform decoding operations using multiple descrambling, corresponding to encoding operations of the encoder 600A.

Figure 7:
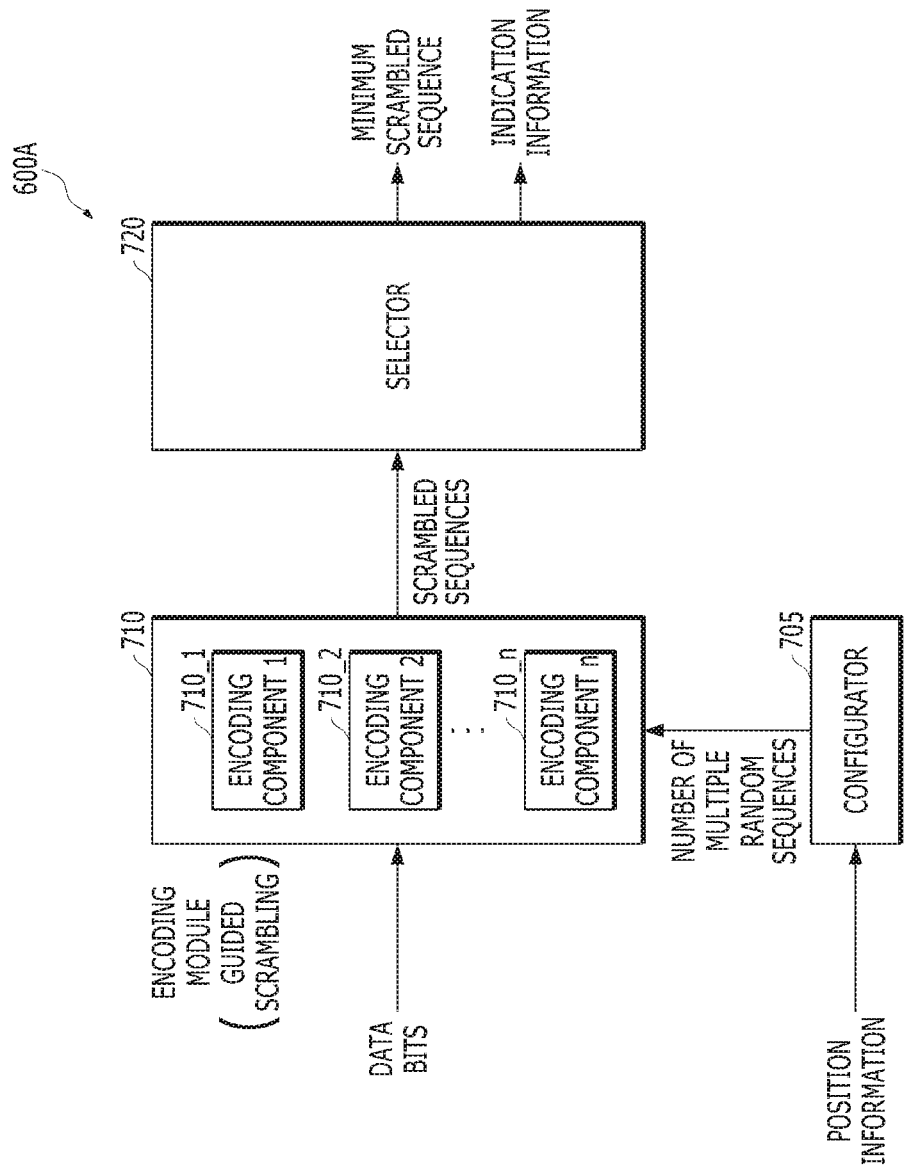
FIG. 7 is a diagram illustrating an encoder in accordance with an embodiment of the present invention.

FIG. 7 is a diagram illustrating an encoder in accordance with an embodiment of the present invention. For example, the encoder of FIG. 7 may depict the encoder 600A shown in FIG. 6. In various embodiments, the encoder 600A may perform adaptive guided scrambling to choose the number of multiple scramblers to be used with respect to a block index, a wordline index and a page index for data to be written. In other words, the encoder 600A may not use the same number of scramblers; instead, the encoder 600A may use multiple scramblers, the number of which is adaptively determined. Further, based on the page type of the data, the encoder 600A may choose a sequence with highest number of logic bit values (1's or 0's) which causes the lowest raw bit error rate, among multiple sequences. In other words, the encoder 600A may output a sequence with the lowest number of logic bit values, which contributes to a high raw bit error rate when writing data in a memory device.

Referring to FIG. 7, the encoder 600A may include a configurator 705, an encoding module (or guided scrambling module) 710 and a selector 720. The encoder 600A may receive data bits and position information from a host. Further, the encoder 600A may output minimum scrambled sequence among a plurality of scrambled sequences. The minimum scrambled sequence is that which has the lowest number of the logic bit value that tends to cause a high raw bit rate. In various embodiments, the position information may include information regarding a storage area among a plurality of storage areas of a memory device (e.g., a memory device 200 of FIG. 6) in which the data bits are to be stored. For example, the position information may include information regarding a block, a wordline and a logical page associated with the storage area (e.g., a block index, a wordline index and a logical page index).

The configurator 705 may obtain the position information and determine the number of multiple random sequences to be used in the encoding module 710, based on the position information. In other words, the configurator 705 may decide how many random sequences are used in the encoding module 710. In various embodiments, the position information may be obtained from a command associated with the data bits (e.g., a write command from the host).

The encoding module 710 may include a plurality of encoding components, for example, a first encoding component 710_1, a second encoding component 710_2 up to an nth encoding component 710_n. In various embodiments, the number of encoding components in the encoding module 710 may be determined by the configurator 705. In other words, encoding components in the encoding module 710 may be variably or adaptively configured to correspond to the number of multiple random sequences by the configurator 705.

The plurality of encoding components 710_1 to 710_n may receive the data bits and scramble the data bits using multiple random sequences, to generate a plurality of scrambled sequences.

In various embodiments, the plurality of encoding components 710_1 to 710_n may include a plurality of random generators and a plurality of scramblers. Each of the plurality of encoding components 710_1 to 710_n may include a random generator and a scrambler. The plurality of random generators may generate the multiple random sequences using a plurality of seeds. The plurality of scramblers may scramble the data bits to generate the plurality of scrambled sequences, using the multiple random sequences. Each of the plurality of scramblers may scramble the data bits, using the corresponding random sequence among the multiple random sequences.

In various embodiments, each of the plurality of encoding components 710_1 to 710_n may further include a counter for counting a value and outputting a counted value. The counter may count the number of a particular logic value in a corresponding scrambled sequence among the plurality of scrambled sequences and output a corresponding counted value. For example, the counter may count the number of 0's or 1's in the corresponding scrambled sequence.

The selector 720 may receive the plurality of scrambled sequences and select a scrambled sequence among the plurality of scrambled sequences. In various embodiments, the selector 720 may select a scrambled sequence having the lowest number of logic high values "1's" or logic low values "0's". In other words, the selector 720 may select a minimum scrambled sequence among the plurality of scrambled sequences. The selector 720 may provide a memory device (e.g., the memory device 200 of FIG. 6) with the selected scrambled sequence to be stored in a corresponding storage area of the memory device 200. Further, the selector 720 may provide the memory device with indication information. The indication information may identify the random sequence from which the selected scrambled sequence was generated.

In various embodiments, in addition to elements shown in FIG. 7, the encoder 600A may include an error correction code (ECC) encoder such as a low density parity check (LDPC) encoder. The ECC encoder may receive the selected scrambled sequence from the selector 720, encode the received scrambled sequence using an error correction code and provide the encoded scrambled sequence to the memory device.

Figure 8:
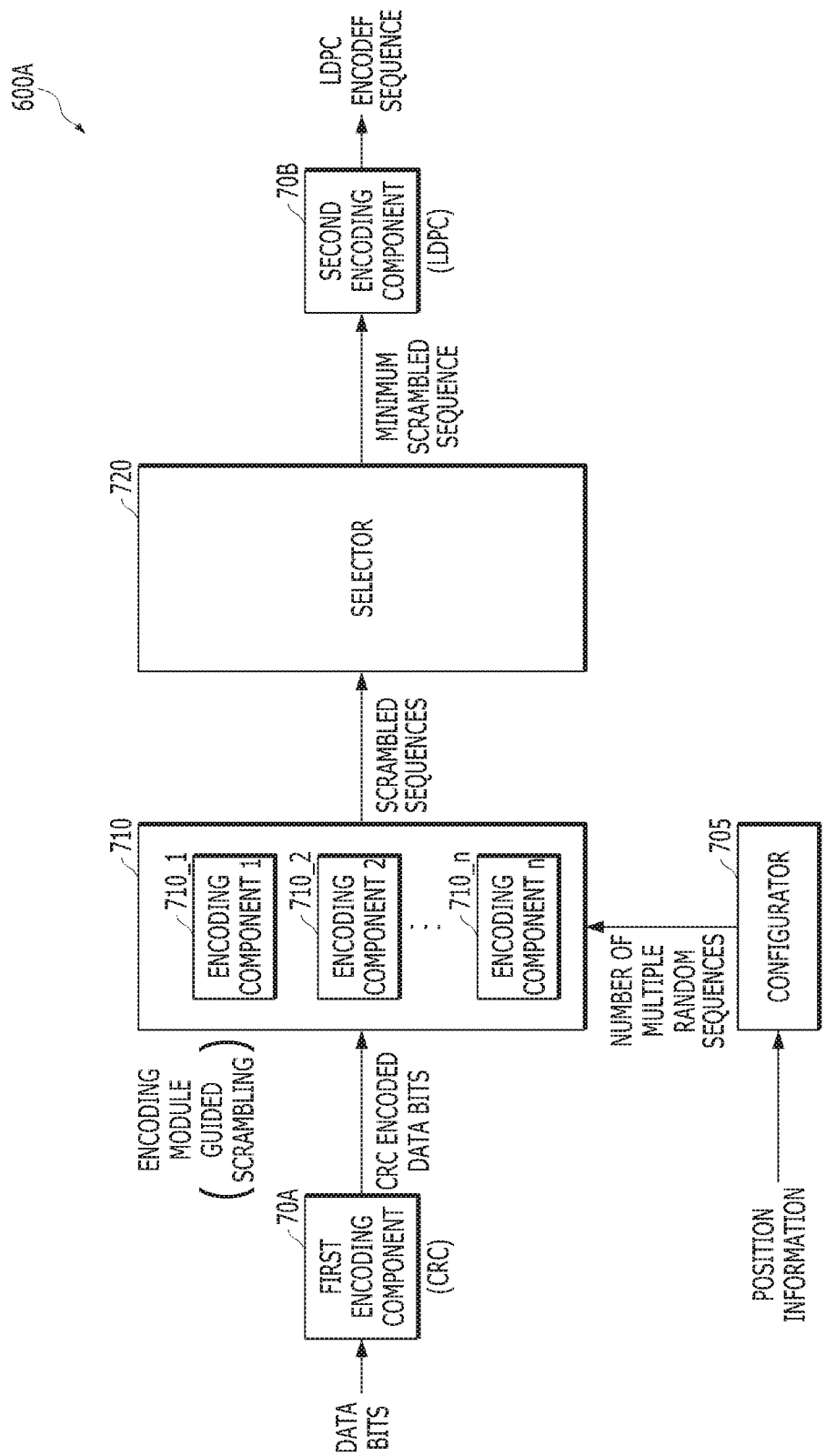
FIG. 8 is a diagram illustrating an encoder in accordance with an embodiment of the present invention.

FIG. 8 is a diagram illustrating an encoder in accordance with an embodiment of the present invention. For example, the encoder of FIG. 8 may depict the encoder 600A shown in FIG. 6.

Referring to FIG. 8, the encoder 600A may include a configurator 705, an encoding module (or guided scrambling module) 710 and a selector 725, similar to the encoder 600A as shown in FIG. 7. Further, the encoder 600A may include a first encoding component 70A and a second encoding component 70B.

The first encoding component 70A may receive the data bits from the host. The first encoding component 70A may encode the received data bits using a cyclic redundancy code (CRC) to generate CRC encoded data bits. The first encoding component 70A may output the CRC encoded data bits to the plurality of encoding components 710_1 to 710_n of the encoding module 710.

The second encoding component 70B may receive the selected scrambled sequence (i.e., the minimum scrambled sequence) from the encoding module 710. The second encoding component 70B may encode the received scrambled sequence using a low density parity check (LDPC) to generate an LDPC encoded sequence. The second encoding component 70B may output the LDPC encoded sequence to the memory device 200.

The selector 725 may receive the plurality of scrambled sequences and select a scrambled sequence among the plurality of scrambled sequences. In various embodiments, the selector 725 may select a scrambled sequence having the lowest number of logic high values "1's" or logic low values "0's". In other words, the selector 725 may select a minimum scrambled sequence among the plurality of scrambled sequences, where "minimum" refers to the lowest number of the particular logic value under consideration. The selector 725 may provide a memory device (e.g., the memory device 200 of FIG. 6) with the selected scrambled sequence to be stored in a corresponding storage area of the memory device 200. Unlike the selector 720 of FIG. 7, it is noted that the selector 725 may not provide the memory device with indication information, which may identify the random sequence from which the selected scrambled sequence was generated.

As described above, the encoder 600A may be coupled between the CRC encoding component 70A and the LDPC encoding component 70B. Indication information for the selected scrambled sequence may be not provided and stored in the corresponding page of the memory device. To recover data bits, the indication information may be recovered with the aid of the CRC parity bits. At a decoder, all candidate random sequences may be tested in parallel. The random sequence corresponding to the CRC syndrome having all zeros may be selected to recover the data bits.

Figure 9A:
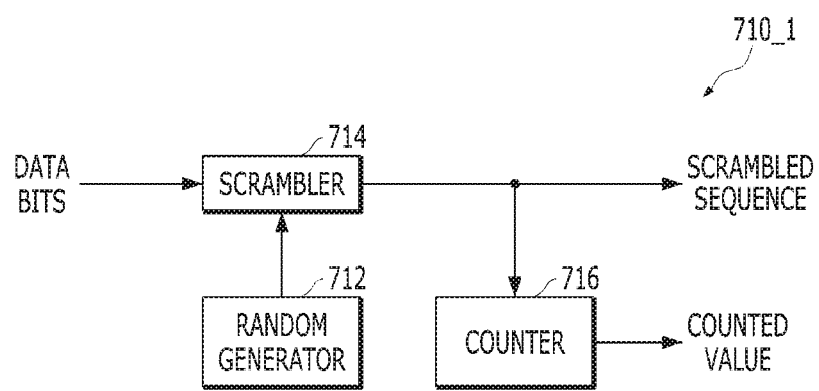
FIG. 9A is a diagram illustrating an encoding component in accordance with an embodiment of the present invention.

FIG. 9A is a diagram illustrating an encoding component 710_1 in accordance with an embodiment of the present invention. For example, the encoding component of FIG. 9A may depict one of the encoding components 710_1 to 710_9 shown in FIG. 7.

Referring to FIG. 9A, a representative encoding component 710_1, of the encoding components 710_1 to 710_9, may include a random generator 712, a scrambler 714 and a counter 716. The random generator 712 may generate a random sequence. In various embodiments, the random generator 712 may generate a pseudo random sequence. The scrambler 714 may scramble the data bits to generate a scrambled sequence, using the random sequence. In various embodiments, the scrambler 714 may scramble the data bits by performing an XOR operation on the data bits with the random sequence. The counter 716 may count the number of a particular logic values ("0's" or "1's") in the scrambled sequence to generate a counted value for output.

Although FIG. 9A show that the random generator 712 and the scrambler 714 are implemented independently, the random generator 712 and the scrambler 714 may be integrated or combined and the combination referred to as a scrambler.

Figure 9B:
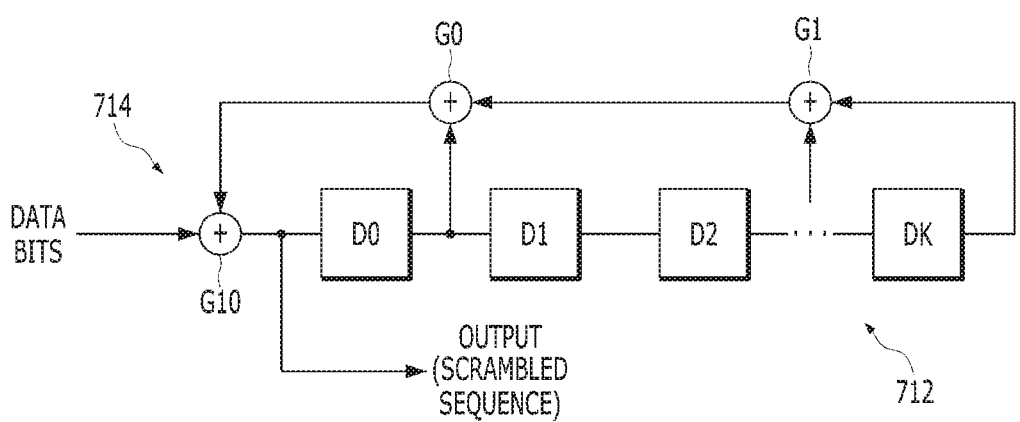
FIG. 9B is a diagram illustrating a random generator and a scrambler in accordance with an embodiment of the present invention.

FIG. 9B is a diagram illustrating a random generator and a scrambler in accordance with an embodiment of the present invention. For example, the random generator and the scrambler of FIG. 9B may depict the random generator 712 and the scrambler 714 shown in FIG. 9A, respectively.

Referring to FIG. 9B, the random generator 712 may include a plurality of shift registers D0 to Dk as linear feedback shift registers (LFSRs) and an exclusive OR gates G0 to G1. The random generator 712 may generate a random sequence in a pseudo random way. The scrambler 714 may include an exclusive OR gate G0. The scrambler 714 may receive the random sequence and data bits and scramble the data bits using the random sequence to output a scrambled sequence.

In various embodiments, the random generator 712 may be implemented with k shift registers D0 to Dk, the number of which may be determined based on the type of page to which the data bits are to be written.

Figure 10A:
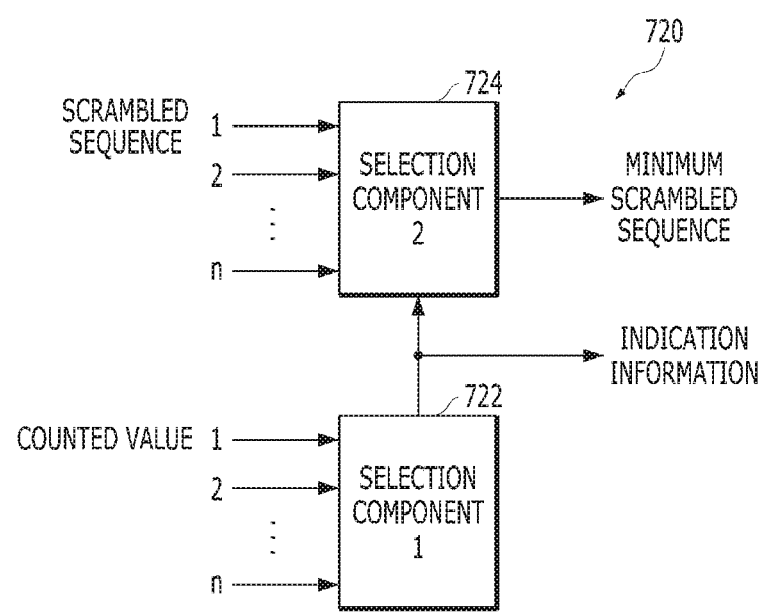
FIG. 10A is a diagram illustrating a selector in accordance with an embodiment of the present invention.

FIG. 10A is a diagram illustrating a selector 720 in accordance with an embodiment of the present invention. For example, the selector of FIG. 10A may depict the selector 720 shown in FIG. 7.

Referring to FIG. 10A, the selector 720 may include a first selection component 722 and a second selection component 724.

The first selection component 722 may receive a plurality of (e.g., n) counted values, i.e., counts, from counters of the encoding components 710_1 to 710_n in FIG. 7. The first selection component 722 may select the lowest counted value among the plurality of counted values. The first selection component 722 may output indication information indicating a random sequence among the plurality of random sequences, corresponding to the lowest counted value. The indication information may be transmitted to the memory device 200 of FIG. 6 and the second selection component 724.

The second selection component 724 may receive a plurality of (e.g., n) scrambled sequences from scramblers of the encoding components 710_1 to 710_n in FIG. 7. The second selection component 724 may select the minimum scrambled sequence among the plurality of (e.g., n) scrambled sequences, based on the indication information. The second selection component 1924 may output, to the memory device 200, the minimum scrambled sequence.

Figure 10B:
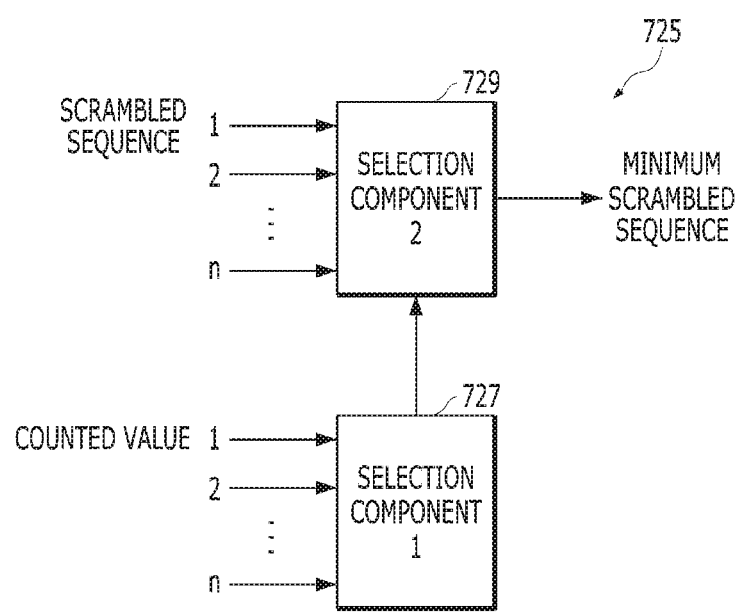
FIG. 10B is a diagram illustrating a selector in accordance with an embodiment of the present invention.

FIG. 10B is a diagram illustrating a selector 725 in accordance with an embodiment of the present invention. For example, the selector of FIG. 10B may depict the selector 725 shown in FIG. 8.

Referring to FIG. 10B, the selector 725 may include a first selection component 727 and a second selection component 729.

The first selection component 727 may receive a plurality of (e.g., n) counted values, i.e., counts, from counters of the encoding components 710_1 to 710_n in FIG. 7. The first selection component 727 may select the lowest counted value among the plurality of counted values. The first selection component 727 may output indication information indicating a random sequence among the plurality of random sequences, corresponding to the lowest counted value. The indication information may be transmitted to the second selection component 729.

The second selection component 729 may receive a plurality of (e.g., n) scrambled sequences from scramblers of the encoding components 710_1 to 710_n in FIG. 7. The second selection component 729 may select the minimum scrambled sequence among the plurality of (e.g., n) scrambled sequences, based on the indication information. The second selection component 729 may output, to the memory device 200, the minimum scrambled sequence.

Figure 11:
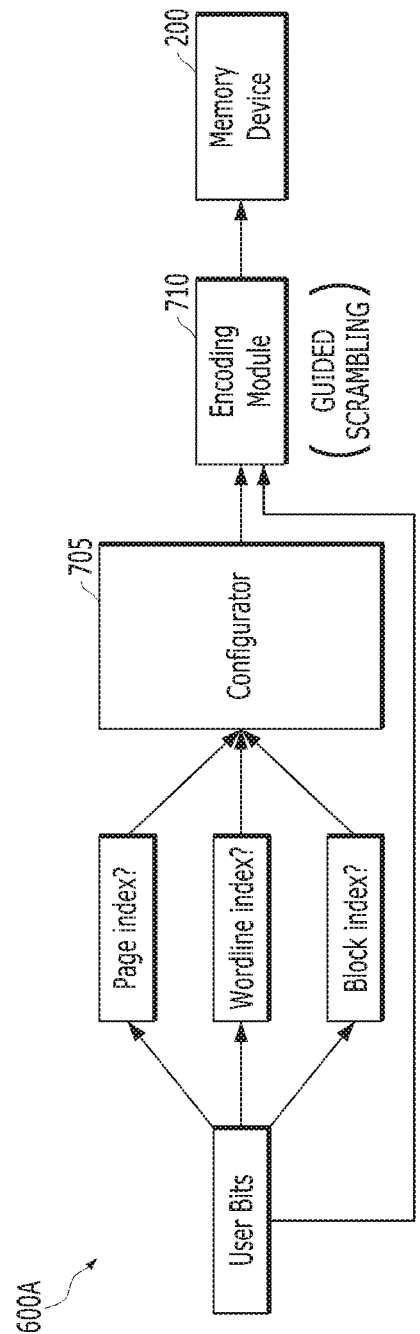
FIG. 11 is a diagram illustrating a memory system including an encoder in accordance with an embodiment of the present invention.

FIG. 11 is a diagram illustrating a memory system including an encoder in accordance with an embodiment of the present invention.

Referring to FIG. 11, the memory system may include a controller including an encoder 600A and a memory device 200. The encoder 600A may include a configurator 705 and an encoding module (or a guided scrambling module) 710 as shown in FIG. 7 or FIG. 8. The configurator 705 configures the encoding module 710 with appropriate numbers of scramblers and registers based on position information, as explained below.

User bits (e.g., CRC coded user bits) of a logical page may be fed into the encoder 600A, then the position information associated with the user bits may be obtained. The position information may include a block index, a wordline index and a page index. The configurator 705 may configure parameters for the encoding module 710 according to the position information. In other words, the configurator 705 may decide how many random sequences are used for the encoding module 710. The number of random sequences may be considered to be variable.

For pages between 1-288 of the LSB in FIG. 5A, the configurator 705 may configure such that the encoding module 710 has 4 scramblers with 12 registers and chooses the sequence with the lowest number of 1's. For pages between 289-576 of the LSB in FIG. 5A, the configurator 705 may configure such that the encoding module 710 has 8 scramblers with 24 registers and chooses the sequence with the lowest number of 1's. In other words, based on the position information, the configurator 705 may configure the encoding module 710 with more scramblers and registers as the bit error rate increases.

For pages between 1-288 of the MSB in FIG. 5A, the configurator 705 may configure such that the encoding module 710 has 8 scramblers with 24 registers and chooses the sequence with the lowest number of 0's. For pages between 289-576 of the MSB in FIG. 5A, the configurator 705 may configure such that the encoding module 710 has 4 scramblers with 12 registers and chooses the sequence with the lowest number of 0's. In other words, based on the position information, the configurator 705 may configure the encoding module 710 with more scramblers and registers as the bit error rate increases.

The encoding module 710 may generate a plurality of scrambled sequences as candidates, by scrambling the data bits using multiple random sequences corresponding to the decided number by the configurator 705. The encoding module 710 may count a particular logic value in each candidate. Among the plurality of scrambled sequences, the minimum scrambled sequence with lowest number of logic value (bit-1's (or "1's") or bit-0's (or "0's")) may be selected.

As described above, user bits of a page are encoded using adaptive guided scrambling to reduce the occurrences of bit-1 and bit-0 before the programming operation thereof. The setting of the guided scrambling depends on position information (i.e., the page index, wordline index and block index) associated with the user bits. The sequence with the lowest number of 1's or 0's using different number of scramblers is selected and stored on cells of the memory device.

FIG. 12 is a flowchart illustrating an operation 1200 of an encoder in accordance with an embodiment of the present invention. For example, the operation of FIG. 12 may be performed by the memory controller 100 including the encoder 600A of FIGS. 6 and 7 to 11.

Referring to FIG. 12, the encoding operation 1200 may include operations 1210, 1220, 1230, 1240 and 1250. The operation 1210 may include receiving data bits and position information regarding a storage area among a plurality of storage areas of a memory device in which the data bits are to be stored. The operation 1220 may include determining the number of multiple random sequences to be used based on the position information.

In various embodiments, the position information includes information regarding a block, a wordline and a logical page associated with the storage area.

In various embodiments, the operation 1200 may further include obtaining the position information from a command associated with the data bits.

In various embodiments, the operation 1200 may further include configuring a plurality of random generators based on the determined number and generating the multiple random sequences using a plurality of seeds.

The operation 1230 may include scrambling the data bits using the multiple random sequences corresponding to the determined number, to generate a plurality of scrambled sequences.

In various embodiments, the operation 1230 may include scrambling, by each of a plurality of scramblers, the data bits by performing an XOR operation on the data bits with a corresponding random sequence among the multiple random sequences.

In various embodiments, the operation 1200 may further include counting the number of a particular logic value in each of a plurality of scrambled sequences, to generate a plurality of counted values, one for each scrambled sequence. A separate counter may be used for each scrambled sequence.

The operation 1240 may include selecting a scrambled sequence among the plurality of scrambled sequences, the selected scrambled sequence having the lowest number of a particular logic value.

In various embodiments, the operation 1240 may include selecting the lowest count among the plurality of counts, selecting the scrambled sequence corresponding to the lowest count among the plurality of scrambled sequences and outputting the selected scrambled sequence. The lowest count may represent the lowest number of the particular logic value.

The operation 1250 may include outputting the selected scrambled sequence to be stored in the storage area of the memory device.

In various embodiments, the operation 1200 may further include encoding the data bits using a cyclic redundancy code (CRC) to generate CRC encoded data bits and outputting the CRC encoded data bits to be scrambled, encoding the selected scrambled sequence using a low density parity check (LDPC) to generate an LDPC encoded sequence and outputting the LDPC encoded sequence to the memory device.

In various embodiments, the logical page includes a selected logical page of a most significant bit (MSB) page, a center significant bit (CSB) page and a least significant bit (LSB) page.

In various embodiments, the selected logical page includes a logical page having a ratio of a first probability to a second probability that is greater than a threshold value.

The first probability represents a probability of a logic high value stored in the memory device being incorrectly read as a logic low value, and the second probability represents a probability of a logic low value stored in the memory device being incorrectly read as a logic high value.

As described above, the memory system including the encoder in accordance with embodiments may perform adaptively encoding user bits of a page by multiple random scramblers and selecting the sequence which results in the fewest number of weak bits, thus reducing raw bit errors in the memory device such as a flash memory.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives that fall within the scope of the claims.

What is claimed is:

1. A system comprising:
a memory device including a plurality of storage areas; and
a controller including an encoder suitable for:
receiving data bits and position information regarding a storage area among the plurality of storage areas in which the data bits are to be stored;
determining a number of multiple random sequences to be used based on the position information;
scrambling the data bits using the determined number of multiple random sequences, to generate a plurality of scrambled sequences;
selecting a scrambled sequence among the plurality of scrambled sequences, the selected scrambled sequence having the lowest number of a particular logic value among the plurality of scrambled sequences; and
outputting the selected scrambled sequence for storage in the storage area of the memory device.

2. The system of claim 1, wherein the position information includes information regarding a block, a wordline and a logical page associated with the storage area.

3. The system of claim 2, wherein the encoder includes:
a configurator suitable for obtaining the position information from a command associated with the data bits and determining the number of multiple random sequences based on the position information.

4. The system of claim 3, wherein the encoder includes:
a plurality of random generators configured based on the determined number, suitable for generating the multiple random sequences using a plurality of seeds;
a plurality of scramblers suitable for scrambling the data bits to generate the plurality of scrambled sequences, using the multiple random sequences, wherein each of the plurality of scramblers scrambles the data bits, using the corresponding random sequence among the multiple random sequences; and
a selector suitable for selecting the scrambled sequence having the lowest number of the particular logic value among the plurality of scrambled sequences,
wherein the encoder includes a plurality of encoding components, each of the plurality of encoding components including a corresponding random generator among the plurality of random generators and a corresponding scrambler among the plurality of scramblers.

5. The system of claim 4, wherein each of the plurality of scramblers scrambles the data bits by performing an XOR operation on the data bits with a corresponding random sequence among the multiple random sequences.

6. The system of claim 4, wherein the encoder further includes a plurality of counters suitable for outputting a plurality of counts,
each of the plurality of counters suitable for counting the number of the particular logic value in a corresponding scrambled sequence among the plurality of scrambled sequences, to output a corresponding count, and
each of the plurality of encoding components including a corresponding counter among the plurality of counters.

7. The system of claim 6, wherein the selector includes:
a first selection component suitable for receiving the plurality of counts and selecting therefrom the lowest count; and
a second selection component suitable for receiving the plurality of scrambled sequences, selecting the scrambled sequence corresponding to the lowest count among the plurality of scrambled sequences and outputting the selected scrambled sequence.

8. The system of claim 7, wherein the encoder further includes:
a first encoding component suitable for receiving the data bits, encoding the received data bits using a cyclic redundancy code (CRC) to generate CRC encoded data bits and outputting the CRC encoded data bits to the plurality of scramblers; and
a second encoding component suitable for receiving the selected scrambled sequence, encoding the received scrambled sequence using a low density parity check (LDPC) to generate an LDPC encoded sequence and outputting the LDPC encoded sequence to the memory device.

9. The system of claim 3, wherein the logical page includes a selected logical page of a most significant bit (MSB) page, a center significant bit (CSB) page and a least significant bit (LSB) page.

10. The system of claim 9, wherein the selected logical page includes a logical page having a ratio of a first probability to a second probability that is greater than a threshold value, the first probability indicating a probability of a logic high value stored in the memory device being incorrectly read as a logic low value, and the second probability indicating a probability of a logic low value stored in the memory device being incorrectly read as a logic high value.

11. A method for operating a system, which includes a memory device including a plurality of storage areas, the method comprising:
receiving data bits and position information regarding a storage area among the plurality of storage areas in which the data bits are to be stored;
determining a number of multiple random sequences to be used based on the position information;
scrambling the data bits using the determined number of multiple random sequences, to generate a plurality of scrambled sequences;
selecting a scrambled sequence among the plurality of scrambled sequences, the selected scrambled sequence having the lowest number of a particular logic value among the plurality of scrambled sequences; and
outputting the selected scrambled sequence for storage in the storage area of the memory device.

12. The method of claim 11, wherein the position information includes information regarding a block, a wordline and a logical page associated with the storage area.

13. The method of claim 12, further comprising:
obtaining the position information from a command associated with the data bits.

14. The method of claim 13, further comprising:
configuring a plurality of random generators based on the determined number; and
generating the multiple random sequences using a plurality of seeds.

15. The method of claim 14, wherein the scrambling of the data bits comprises:
scrambling, by each of a plurality of scramblers, the data bits by performing an XOR operation on the data bits with a corresponding random sequence among the multiple random sequences.

16. The method of claim 14, further comprising:
counting, by each of a plurality of counters, the number of the particular logic value in a corresponding scrambled sequence among the plurality of scrambled sequences, to output a corresponding count among a plurality of counts.

17. The method of claim 16, wherein the selecting of the scrambled sequence comprises:
selecting the lowest counted value among the plurality of counts;
selecting the scrambled sequence corresponding to the lowest counted value among the plurality of scrambled sequences; and
outputting the selected scrambled sequence.

18. The method of claim 17, further comprising:
encoding the data bits using a cyclic redundancy code (CRC) to generate CRC encoded data bits and outputting the CRC encoded data bits to be scrambled; and
encoding the selected scrambled sequence using a low density parity check (LDPC) to generate an LDPC encoded sequence to output the LDPC encoded sequence to the memory device.

19. The method of claim 13, wherein the logical page includes a selected logical page of a most significant bit (MSB) page, a center significant bit (CSB) page and a least significant bit (LSB) page.

20. The method of claim 19, wherein the selected logical page includes a logical page having a ratio of a first probability to a second probability that is greater than a threshold value, the first probability indicating a probability of a logic high value stored in the memory device being incorrectly read as a logic low value, and the second probability indicating a probability of a logic low value stored in the memory device being incorrectly read as a logic high value.

* * * * *